United States Patent
Lee et al.

(10) Patent No.: US 10,326,404 B2
(45) Date of Patent: Jun. 18, 2019

(54) LOW POWER TIME AMPLIFIER AND OPERATING METHOD THEREOF

(71) Applicant: Gwangju Institute of Science and Technology, Gwangju (KR)

(72) Inventors: Min Jae Lee, Gwangju (KR); Min Uk Heo, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/926,951

(22) Filed: Mar. 20, 2018

(65) Prior Publication Data

US 2018/0302037 A1    Oct. 18, 2018

(30) Foreign Application Priority Data

Apr. 14, 2017  (KR) .......... 10-2017-0048655

(51) Int. Cl.
| | |
|---|---|
| *H03L 7/06* | (2006.01) |
| *H03F 1/02* | (2006.01) |
| *H03K 5/01* | (2006.01) |
| *H03K 3/356* | (2006.01) |
| *H03K 5/15* | (2006.01) |

(52) U.S. Cl.
CPC ..... *H03F 1/0211* (2013.01); *H03K 3/356182* (2013.01); *H03K 5/01* (2013.01); *H03K 5/15006* (2013.01)

(58) Field of Classification Search
CPC ........................................ H03L 7/06

USPC .................................... 330/127, 280
See application file for complete search history.

(56) References Cited

U.S. PATENT DOCUMENTS

| | | | | |
|---|---|---|---|---|
| 7,028,206 | B2* | 4/2006 | Waller | G06F 1/12 327/149 |
| 7,622,960 | B2* | 11/2009 | Takai | H03D 13/004 327/12 |
| 2008/0218216 | A1* | 9/2008 | Takai | H03D 13/004 327/12 |
| 2009/0138742 | A1* | 5/2009 | Wong | G06F 5/06 713/400 |
| 2019/0019543 | A1* | 1/2019 | Ma | G11C 5/148 |

OTHER PUBLICATIONS

Vladimir Stojanovic et al., "Comparative Analysis of Latches and Flip-Flops for High-Performance Systems", International Conference on Computer Design: VLSI in Computers and Processors, Oct. 1998, pp. 1-6.
Minuk Heo et al., "Low-power programmable high-gain time difference amplifier with regeneration time control", Electronic Letters, Jul. 31, 2014, pp. 1129-1131, vol. 50, No. 16.

* cited by examiner

*Primary Examiner* — Henry Choe

(57) ABSTRACT

A time amplifier includes a first signal regeneration circuit, a second signal regeneration circuit, a first delay circuit configured to receive the second input signal and output the delayed second input signal by a predetermined delay time, and a second delay circuit configured to receive the first input signal and output the delayed first input signal by the predetermined delay time. A corresponding signal regeneration operation is stopped when at least one of the first and second output signals is high. The at least one output signal remains high.

20 Claims, 4 Drawing Sheets

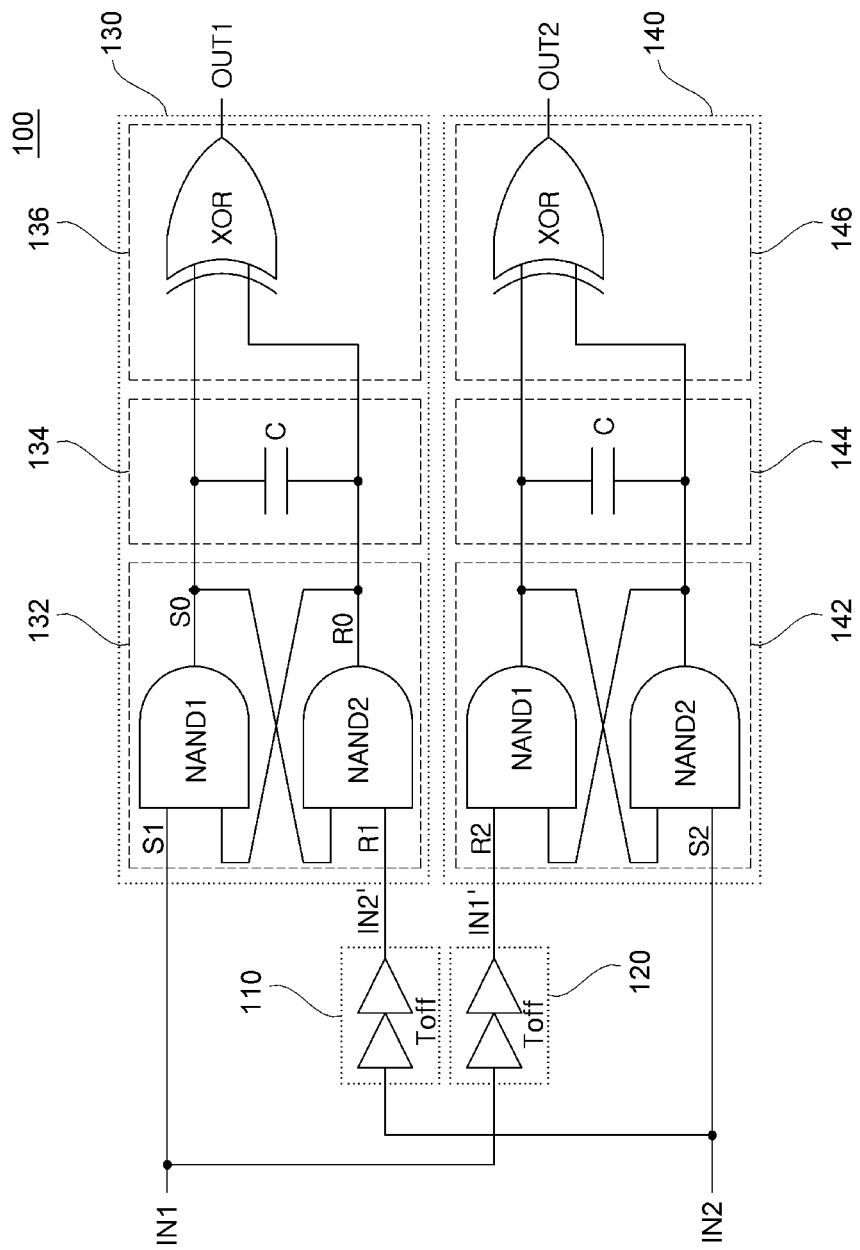
[FIG.1]

[FIG.2]
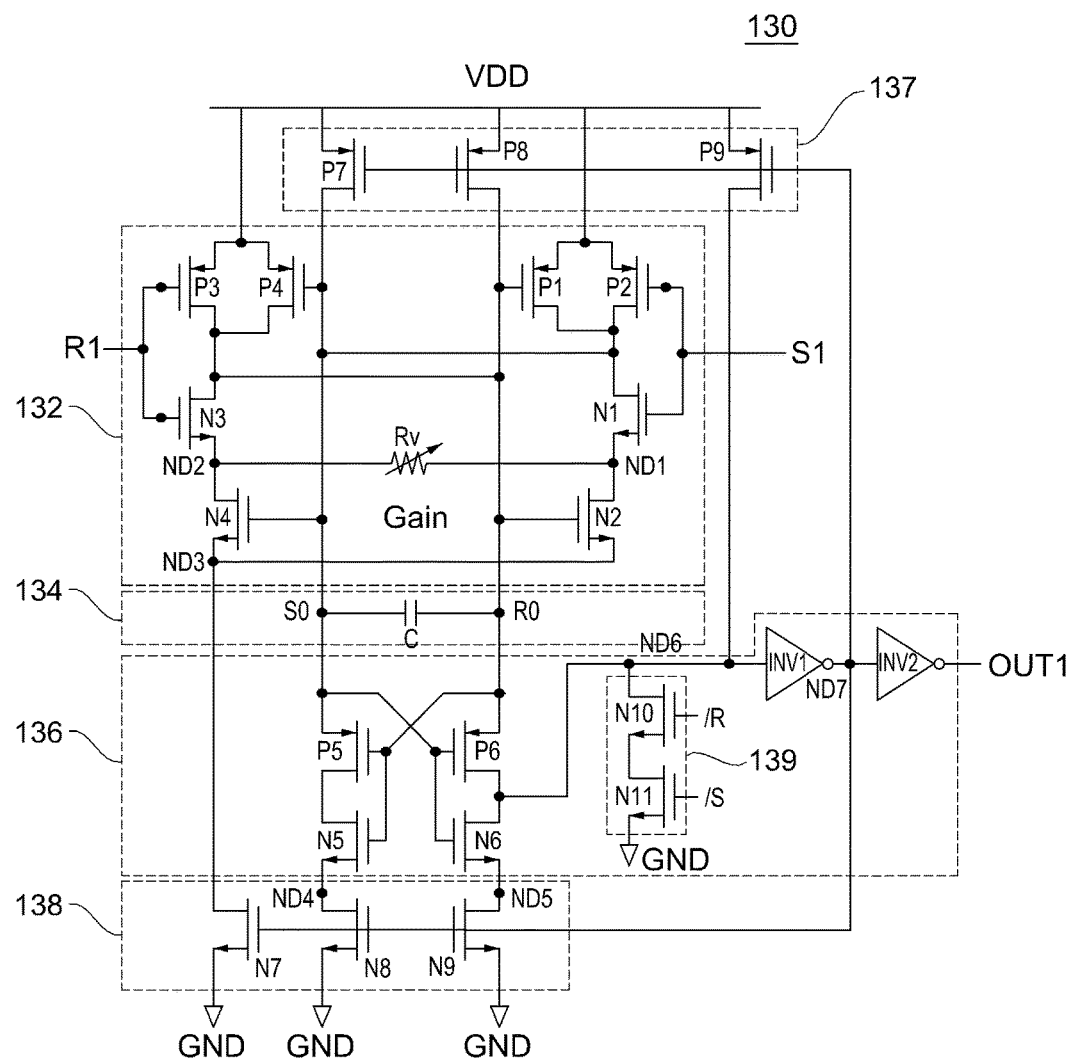

[FIG.3]
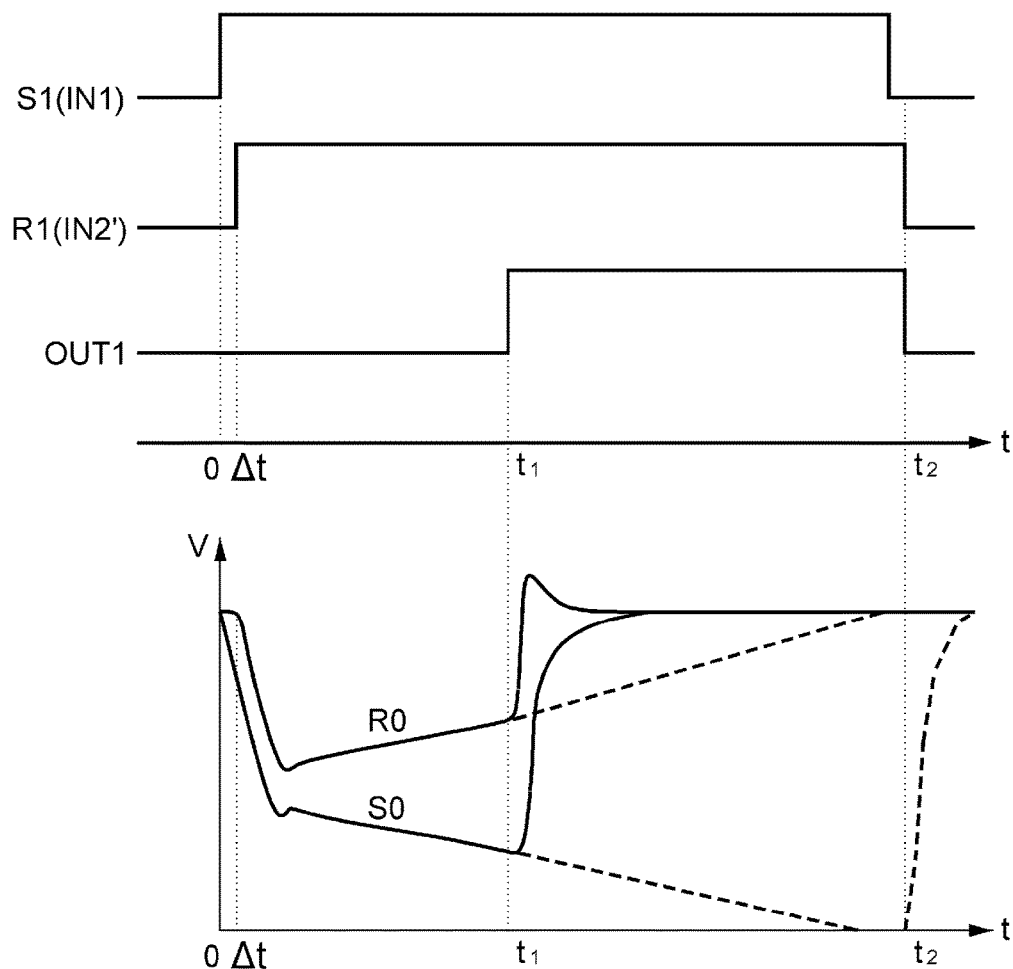

[FIG.4]
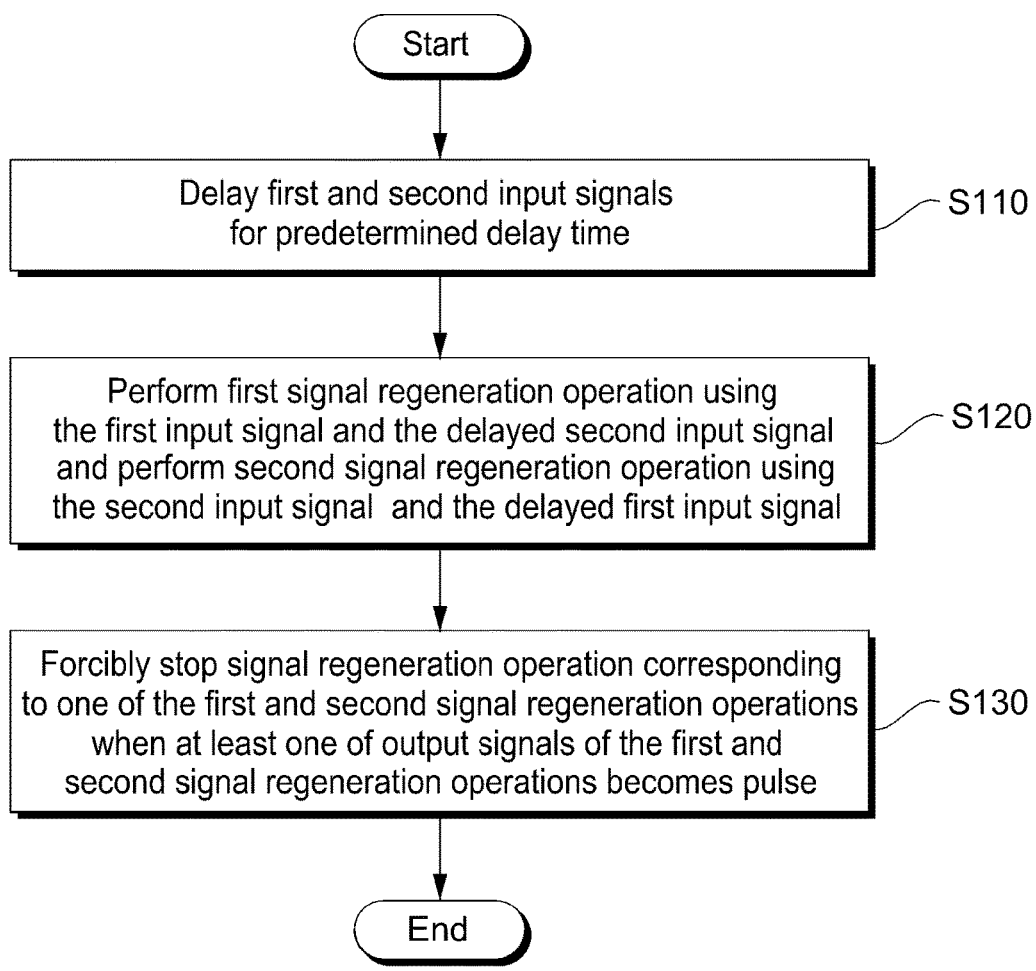

LOW POWER TIME AMPLIFIER AND OPERATING METHOD THEREOF

CROSS-REFERENCE TO RELATED APPLICATIONS

This US non-provisional patent application claims priority under 35 USC § 119 to Korean Patent Application No. 10-2017-0048655, filed on Apr. 14, 2017, the entirety of which is hereby incorporated by reference.

TECHNICAL FIELD

Embodiments of the present disclosure relate to a low power time amplifier for reducing power consumption and an operating method thereof.

BACKGROUND

In general, a time amplifier is used to increase the resolution of a time-to-digital converter (TDC) or a phase-locked loop (PLL). Basically, a time amplifier employs an SR latch (disclosed in Korean Patent Publication No. 10-2014-0125950 (published on Oct. 30, 2014)) and a gain amplifier to amplify a time difference (input value) between two input signals using metastability of a transistor.

For example, a conventional time amplifier generates two output pulses for a regeneration time after amplifying a difference between two input times of two input signals by a gain of a gain amplifier. The regeneration time means a time until two input pulses are output since they were input. If the regeneration time increases, the gain of the gain amplifier also increases. However, a capacitor included in the time amplifier has suffered from the disadvantage that power consumption finally increases as the amount and voltage of current generated during charging/discharging increase.

Additionally, to reduce the above-mentioned power consumption, the conventional time amplifier may reduce the regeneration time by decreasing a high gain after giving an output of the gain. Unfortunately, the conventional time amplifier has suffered from the disadvantages that the gain is limited to a minimum gain and power consumption increases due to a voltage charged to a capacitor.

SUMMARY

The present disclosure provides a time amplifier and a method for operating the same which may reduce power consumption by controlling the level of a voltage applied a charging unit instead of controlling gain amplification.

Example embodiments of the present disclosure provide a time amplifier. The time amplifier includes: a first signal regeneration circuit configured to perform a first signal regeneration operation using a metastable state of a first latch operation on a first input signal and a delayed second input signal and output a first output signal; a second signal regeneration circuit configured to perform a second signal regeneration operation using a metastable state of a second latch operation on a second input signal and a delayed first input signal and output a second output signal; a first delay circuit configured to receive the second input signal and output the delayed second input signal by a predetermined delay time; and a second delay circuit configured to receive the first input signal and output the delayed first input signal by the predetermined delay time. A corresponding signal regeneration operation may be stopped when at least one of the first and second output signals is high. The at least one output signal may remain high.

In example embodiments, the first signal regeneration circuit may include: a first latch unit configured to receive and latch the first input signal and the delayed second input signal; a first charging unit configured to charge an electric charge corresponding to a difference between a voltage at a first latch output node of the first latch unit and a voltage at a second latch output node of the first latch unit; and a first gate output unit configured to perform a logical operation on the voltage at the first latch output node and the voltage at the second latch output node to output the first output signal.

In example embodiments, the first latch unit may include an SR latch.

In example embodiments, the first latch unit may include: a first NAND gate configured to perform a NAND operation on the first input signal and the voltage at the second latch output node; and a second NAND gate configured to perform a NAND operation on the delayed second input signal and the voltage at the first latch output node.

In example embodiments, the first NAND gate may include: a first PMOS transistor coupled between a power supply terminal and the first latch output node and having a gate connected to the second latch output node; a second PMOS transistor coupled between the power supply terminal and the first latch output node and having a gate to receive the first input signal; a first NMOS transistor coupled between the first latch output node and a first node and having a gate to receive the first input signal; and a second NMOS transistor coupled between the first node and a third node and having a gate connected to the second latch output node.

In example embodiments, the second NAND gate may include: a third PMOS transistor coupled between the power supply terminal and the second latch output node and having a gate to receive the delayed second input signal; a fourth PMOS transistor coupled between the power supply terminal and the second latch output node and having a gate connected to the first latch output node; a third NMOS transistor coupled between the second latch output node and a second node and having a gate to receive the delayed second input signal; and a fourth NMOS transistor coupled between the second node and the third node and having a gate connected to the first latch output node.

In example embodiments, the first latch unit may further include: a variable resistor coupled between the second node and the first node to adjust a gain of the time amplifier.

In example embodiments, the first charging unit may include: a capacitor coupled between the first latch output node and the second latch output node.

In example embodiments, the first gate output unit may include: an XOR gate configured to perform an XOR operation on the voltage at the first latch output node and the voltage at the second latch output node.

In example embodiments, the XOR gate may include: a fifth PMOS transistor having a source connected to the first latch output node and a gate connected to the second latch output node; a sixth PMOS transistor having a source connected to the second latch output node and a gate connected to the first latch output node; a fifth NMOS transistor coupled between a drain of the fifth PMOS transistor and a fourth node and having a gate connected to the second latch output node; and a sixth NMOS transistor coupled between a drain of the sixth PMOS transistor and a fifth node and having a gate connected to the first latch output node.

In example embodiments, the first gate output unit may include: a first inverter coupled between a sixth node connected to the drain of the sixth PMOS transistor and a seventh node; and a second inverter coupled between the seventh node and an output node to output the first output signal.

In example embodiments, the time amplifier may further include: a first switching unit configured to pull up voltages at the first latch output node, the second latch output node, and the sixth node to a power supply voltage when the first output signal becomes a pulse.

In example embodiments, the first switching unit may include: a seventh PMOS transistor coupled between the power supply terminal and the first latch output node and having a gate connected to the seventh node; an eighth PMOS transistor coupled between the power supply terminal and the second latch output node and having a gate connected to the seventh node; and a ninth PMOS transistor coupled between the power supply terminal and the sixth node and having a gate connected to the seventh node.

In example embodiments, the time amplifier may further include: a second switching unit which includes a seventh NMOS transistor coupled between the third node and a ground terminal and having a gate connected to the seventh node, an eighth NMOS transistor coupled between the fourth node and the ground terminal and having a gate connected to the seventh node, and a ninth NMOS transistor coupled between the fifth node and the ground terminal and having a gate connected to the seventh node.

In example embodiments, the time amplifier may further include: a third switching unit which includes a tenth NMOS transistor having a drain connected to the sixth node and a gate to receive an inverted delayed second input signal and an eleventh NMOS transistor having a drain connected to a source of the tenth NMOS transistor, a source connected to a ground terminal, and a gate to receive an inverted first input signal.

Example embodiments of the present disclosure provide an operating method in a time amplifier. The method may include: delaying a first input signal and a second input signal by a predetermined delay time; performing a first signal regeneration operation through a first latch operation on the first input signal and the delayed second input signal, performing a second signal regeneration operation through a second latch operation on the second input signal and the delayed second input signal; and stopping a corresponding signal regeneration operation when at least one of output signals of the first and second signal regeneration operations becomes a pulse.

In example embodiments, the first and second latch operations may include an SR latch operation.

In example embodiments, stopping the signal regeneration operation may include: pulling up latch output nodes of a corresponding latch operation to a power supply voltage; pulling up an output node corresponding to an output signal to the power supply voltage; and turning off a switching unit connected to a ground terminal.

In example embodiments, the method may further include: pulling down the output node to a ground voltage when the first input signal and the second input signal disappear.

In example embodiments, the method may further include: adjusting a gain using a variable resistor during at least one of the first and second signal regeneration operations.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

FIG. 1 illustrates a time amplifier according to an example embodiment of the present disclosure.

FIG. 2 illustrates a signal regeneration circuit according to an example embodiment of the present disclosure.

FIG. 3 illustrates operation waveforms of a time amplifier according to an example embodiment of the present disclosure.

FIG. 4 is a flowchart illustrating a method for operating a time amplifier according to an example embodiment of the present disclosure.

DETAILED DESCRIPTION

The advantages and features of the present disclosure and methods of achieving them will be apparent from the following exemplary embodiments that will be described in more detail with reference to the accompanying drawings. It should be noted, however, that the present disclosure is not limited to the following exemplary embodiments, and may be implemented in various forms. Accordingly, the exemplary embodiments are provided only to disclose the present disclosure and let those skilled in the art know the category of the present disclosure.

In the specification, it will be understood that when an element is referred to as being "on" another layer or substrate, it can be directly on the other element, or intervening elements may also be present. In the drawings, thicknesses of elements are exaggerated for clarity of illustration.

Exemplary embodiments of the invention will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention. Though terms like a first, a second, and a third are used to describe various elements in various embodiments of the present disclosure, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

A time amplifier for reducing power consumption and a method for operating the same will now be described more fully hereinafter with reference to accompanying drawing, in which example embodiments of the present disclosure are shown.

FIG. 1 illustrates a time amplifier 100 according to an example embodiment of the present disclosure. As illustrated, the time amplifier 100 may include a first delay circuit 110, a second delay circuit 120, a first signal regeneration circuit 130, and a second signal regeneration circuit 140.

The first delay circuit 110 may be configured to receive a second input signal IN2 and delay the second input signal IN2 by a predetermined delay time Toff. The first delay circuit 110 may include at least one delay cell. The delay cell may be, for example, a buffer cell, an inverter or the like.

The second delay circuit 120 may be configured to receive a first input signal IN1 and delay the first input signal by the predetermined delay time Toff. In example embodiments, the second delay circuit 120 may be implemented in the same manner as the first delay circuit 110.

The first signal regeneration circuit 130 may be configured to receive the first input signal IN1 and a second input signal IN2' delayed by the delay time Toff and amplify a time difference between a first input signal IN' and the delay second input signal IN2' by a value corresponding to a gain of the time amplifier 100. In example embodiments, the first regeneration circuit 130 may perform a first signal regeneration operation using a metastable state of a first latch operation on the first input signal IN' and the delayed second input signal IN2' to output a first input signal OUT1. Although the gain of the time amplifier 100 is not shown herein, it may be adjusted using a variable resistor. The detailed description of the relationship between the gain and the variable resistor of the time amplifier 100 is disclosed in the paper entitled "Low-power programmable high-gain time difference amplifier with regeneration time control" (ELECTRONICS LETTERS 31 Jul. 2014 Vol. 50 No. 16 pp. 1129-1131).

The first signal regeneration circuit 130 may include a latch unit 132, a charging unit 134, and an output gate unit 136.

The latch unit 132 may be configured to latch the first input signal IN1 and the delayed second input signal IN2'. In example embodiments, the latch unit 132 may include a set-reset (SR) latch. For example, the latch unit 132 may be implemented using an SR latch where two NAND gates NAND1 and NAND2 are circularly connected to each other. That is, a first latch output node S0 of the latch unit 132 may be connected to one input terminal of one of the first and second NAND gates NAND1 and NAND2 and a second latch output node R0 of the latch unit 132 may be connected to an input terminal of the other of the first and second NAND gates NAND1 and NAND2. Although the latch unit 132 shown in FIG. 1 includes the SR latch, it should be appreciated that the present disclosure is not to be construed as being limited by the illustrative embodiments. The latch unit 132 may be implemented using various types of latches.

An input of one of the first and second NAND gates NAND1 and NAND2 may operate as a set input S1. That is, the set input S1 may include the first input signal IN1. An input of one of other NAND gates NAND1 and NAND2 may operate as a reset input R1. That is, the reset input R1 may include an output signal of the first delay circuit 110, i.e., the delayed second input signal IN2'.

The timing provided at output nodes S0 and R0 of the latch unit 132 may be determined based on a time difference between the first input signal IN1 and the second input signal IN2' by using metastable states of transistors (not shown) constituting the latch unit 132.

The charging unit 134 may be coupled between the first and second latch output nodes S0 and R0 and configured to charge an electric charge corresponding to a difference between voltages at the first and second latch output nodes S0 and R0. In example embodiments, the charging unit 134 may include a capacitor C.

The output gate unit 136 may be configured to receive the voltages at the first and second latch output nodes S0 and R0, compare the voltages at the first and second latch output nodes S0 and R0 (or perform a logic operation), and output a first output signal OUT1 corresponding to a comparison result. In example embodiments, the output gate unit 136 may include an XOR gate. The XOR gate is a logic gate to perform an exclusive operation. Although the output gate unit 136 shown in FIG. 1 includes the XOR gate, it should be appreciated that the present disclosure is not to be construed as being limited by the illustrative embodiments. The output gate unit 136 may be implemented using various types of logic gates.

In particular, the first signal regeneration circuit 130 may be configured to forcibly stop a signal regeneration operation and allow the output signal OUT1 to remain at a high level when generating a stable pulse after getting out of the metastable state of the latch unit 132, i.e., when the output signal OUT1 reaches a predetermined level, e.g., a high level. For example, when the output signal OUT1 reaches a high level, the first signal regeneration circuit 130 may forcibly pull up a voltage corresponding to the output signal OUT1 and the voltages at the first and second latch output nodes S0 and R0 to a power supply voltage VDD. In this case, by eliminating a crowbar current unnecessary until input signals disappear, power consumption of the time amplifier 100 may be reduced to that extent.

The second signal regeneration circuit 140 may be implemented in the same manner as the first regeneration circuit 130, except for received input signals. The second signal regeneration circuit 140 may be configured to receive the second input signal IN2 and the delayed first input signal IN1' and amplify a time difference between the second input signal IN2 and the delayed first input signal IN1' by a value corresponding to the gain of the time amplifier 100. In example embodiments, the second signal regeneration circuit 140 may output a second output signal OUT2 by performing a second signal regeneration operation using a metastable state of a second latch operation on the second input signal IN2 and the delayed first input signal IN1'.

For brevity of description, the detailed description of the configuration of the second signal regeneration circuit 140 will be omitted herein.

By forcibly stopping a signal regeneration operation simultaneously with generation of a regeneration pulse for an input signal, the time amplifier 100 may reduce a crowbar current as compared to a conventional time amplifier and minimize power consumption to that extent.

FIG. 2 illustrates a signal regeneration circuit according to an example embodiment of the present disclosure. For ease of description, the first signal regeneration circuit 130 shown in FIG. 1 is shown in FIG. 2. It should be appreciated that the second signal regeneration circuit 140 may be implemented in the same manner as the first signal regeneration circuit 130 shown in FIG. 2.

Referring to FIG. 2, the first signal regeneration circuit 130 may include a first latch unit 132, a first charging unit 134, a first gate output unit 136, and first, second, and third switching units 137, 138, and 139.

The first latch unit 132 may include p-channel metal-oxide-semiconductor field effect (PMOS) transistors P1, P2, P3, and P4 and n-channel metal-oxide-semiconductor field effect (NMOS) transistors N1, N2, N3, and N4. The PMOS transistors P1 and P2 and the NMOS transistors N1 and N2 may constitute the first NAND gate NAND1 shown in FIG. 1, and the PMOS transistors P3 and P4 and the NMOS transistors N3 and N4 may constitute the second NAND gate NAND2 shown in FIG. 1.

The detailed connection relation of the first NAND gate NAND1 will now be described. The first PMOS transistor P1 may be coupled between a power supply terminal VDD and a first latch output node S0 and have a gate to receive a set input S1. The second PMOS transistor P2 may be coupled between the power supply terminal VDD and the first latch output node S0 and have a gate to receive the set input S1. The first NMOS transistor N1 may be coupled between the first latch output node S0 and a first node ND1 and have a gate to receive the set input S1. The second NMOS transistor N2 may be coupled between the first node ND1 and a third node ND3 and have a gate connected to a second latch output node R0.

The detailed connection relation of the second NAND gate NAND2 will now be described. The third PMOS transistor P3 may be coupled between the power supply terminal VDD and a second latch output node R0 and have a gate to receive a reset input R1. The PMOS transistor P4 may be coupled between the power supply terminal VDD and the second latch output node R0 and have a gate connected to the first latch output node S0. An NMOS transistor N11 may be coupled between the second latch output node R0 and a second node ND2 and have a gate to receive the reset input R1. The third NMOS transistor N3 may be coupled between the second node ND2 and the third node ND3 and have a gate connected to the first latch output node S0.

The first latch unit 132 may include a variable resistor Rv coupled between the first node ND1 and the second node ND2. A gain of the time amplifier 100 may vary depending on a resistance of the variable resistor Rv.

The first charging unit 134 may include a capacitor C coupled between the first latch output node S0 and the second latch output node R0.

The first gate output unit 136 may include PMOS transistors P5 and P6, NMOS transistors N5 and N6, a first inverter INV1, and a second inverter INV2. The PMOS transistors P5 and P6 and the NMOS transistors N5 and N6 may constitute an exclusive OR (XOR) gate XOR shown in FIG. 1.

The detailed connection relation of the XOR gate XOR will now be described. The fifth PMOS transistor P5 may have a drain connected to the first latch output node S0 and a gate connected to the second latch output node R0. The sixth PMOS transistor P6 may have a drain connected to the second latch output node R0 and a gate connected to the first latch output node S0. An NMOS transistor N21 may be coupled between a source of a PMOS transistor P21 and a fourth gate node ND4 and have a gate connected to the second latch output node R0. An NMOS transistor N22 may be coupled between a source of a PMOS transistor P22, i.e., a sixth node and a fifth node ND5 and have a gate connected to the first latch output node S0.

The first signal regeneration circuit 130 may include the first, second, and third switching units 137, 138, and 139 to forcibly stop a signal regeneration operation simultaneously with generation of a pulse and maintain a level of the pulse.

The first switching unit 137 may include PMOS transistors P7, P8, and P9. The seventh PMOS transistor P7 may be coupled between the power supply terminal VDD and the first latch output node S0 and have a gate connected to a seventh node ND7. Thus, the PMOS transistors P7, P8, and P8 constituting the first switching unit 137 may be simultaneously turned on according to a voltage at the seventh node ND7.

The eighth PMOS transistor P8 may be coupled between the power supply terminal VDD and the second latch output node R0 and have a gate connected to the seventh node ND7. The ninth PMOS transistor P9 may be coupled between the power supply node VDD and the sixth node ND6 and have a gate connected to the seventh node ND7. Thus, the PMOS transistors P7, P8, and P9 constituting the first switching unit 137 may be simultaneously turned on according to the voltage at the seventh node ND7.

For example, when the voltage at the seventh node ND7 is a ground voltage, the PMOS transistors P7, P8, and P9 may be simultaneously turned on. Thus, a power supply voltage at the power supply terminal VDD may be applied to the first latch output node S0, the second latch output node R0, and the sixth node ND6 corresponding to the output signal OUT1. In other words, the first switching unit 137 may generate a predetermined pulse after getting out of a metastable state according to a signal regeneration operation of the latch unit 132 and, simultaneously, forcibly apply a power supply voltage to the first latch output node S0, the second latch output node R0, and the sixth node ND6 corresponding to the output signal OUT1.

The second switching unit 138 may include NMOS transistors N7, N8, and N9. The seventh NMOS transistors N9 may be coupled between the third node ND3 and a ground terminal GND and have a gate connected to the seventh node ND7. The eighth NMOS transistor N8 may be coupled between the fourth node ND4 and the ground terminal GND and have a gate connected to the seventh node ND7. The ninth NMOS transistor N9 may be coupled between the fifth node ND5 and the ground terminal GND and have a gate connected to the seventh node ND7. Thus, the NMOS transistors N7, N8, and N8 constituting the second switching unit 138 may be simultaneously turned on according to the voltage at the seventh node ND7.

For example, when the voltage at the seventh node ND7 is a power supply voltage, the NMOS transistors N7, N8, and N9 may be simultaneously turned on. Thus, a ground voltage at the ground terminal GND may be applied to the third node ND3, the fourth node ND4, and the fifth node ND5.

The third switching unit 139 may include NMOS transistors N10 and N11. The tenth and eleventh NMOS transistors N10 and N11 may be coupled in series between the sixth node ND6 and the ground terminal GND. The tenth NMOS transistor N10 may have a gate to receive an inverted reset input /R1. The eleventh NMOS transistor N11 may have a gate to receive an inverted set input /S1. When both the input signals S1 and R1 have a low-level voltage, both the inverted input signals /S1 and /R1 may have a high-level voltage. As both the tenth and eleventh NMOS transistors N10 and N11 are turned on, a voltage at the sixth node ND6 corresponding to the output signal OUT1 may be a ground voltage. That is, when the input signals S1 and R1 disappear, the third switching 139 may forcibly pull down the output signal OUT1 to a ground voltage.

The first signal regeneration circuit 130 may reduce a crowbar current for a signal regeneration time and lower a voltage loaded to the capacitor to minimize power consumption during charging/discharging.

FIG. 3 illustrates operation waveforms of a time amplifier 100 according to an example embodiment of the present disclosure. In FIG. 3, only an operation waveform of the first signal regeneration circuit 130 of the time amplifier 100 will be described for brevity of description.

A time difference Δt means a time difference between a set input S1, i.e., first input signals S1 and IN1 and a reset input R1, i.e., a delayed input signal IN2'. The time difference Δt may include a delay time Toff.

A first time t1 is a time required until a pulse-type output signal OUT1 is output by the signal regeneration circuit 130. Prior to the first time t1, the latch unit 132 may operate in a metastable state.

At the first time t1, the signal regeneration circuit 130 may forcibly pull up voltages at latch output nodes S0 and R0 and a node (e.g., the sixth node ND6 in FIG. 3) corresponding to the output signal OUT1 to a power supply voltage. For example, as shown in FIG. 2, the latch output nodes S0 and R0 and the node corresponding to the pulse-type output signal OUT1 (e.g., the sixth node ND6 in FIG. 3) may be connected to a power supply terminal VDD to provide a power supply voltage simultaneously with generation of the output signal OUT1 according to operations of the first and second switching units 137 and 138. In FIG. 3, dotted portions of the latch output nodes S0 and R0 indicate fluctuation of a voltage which is varied by maintaining a signal regeneration operation in an existing signal regeneration circuit.

A second time t2 means a time until both the input signals S1 and R1 disappear. As shown in FIG. 2, a node corresponding to the output signal OUT1 (e.g., the sixth node ND6) may be connected to the ground terminal GND to provide a ground voltage according to the operation of the third switching unit 139.

The signal regeneration circuit 130 of the time amplifier 100 may eliminate an unnecessary crowbar current flowing between the first time t1 and the second time t2 and forcibly drop a voltage between capacitors C to prevent the voltage from exceeding a threshold voltage of an XOR gate. As a result, power consumption of the time amplifier 100 may be significantly reduced.

FIG. 4 is a flowchart illustrating a method for operating a time amplifier according to an example embodiment of the present disclosure. With reference to FIGS. 1 to 4, a method for operating the time amplifier 100 will now be described.

The first and second delay circuits 110 and 120 may delay corresponding input signals IN1 and IN2 by a predetermined time Toff, respectively (S110). The first regeneration circuit 130 may receive the first input signal IN1 and the delayed second input signal IN2' and perform a first signal regeneration operation using a metastable state of a first latch operation. The second signal regeneration circuit 140 may receive the second input signal IN2 and the delayed first input signal IN1' and perform a second signal regeneration operation using a metastable state of a second latch operation (S120). The first and second latch operations may include an SR latch operation. When a pulse corresponding to an output signal is generated during at least one of the first signal regeneration operation and the second signal regeneration operation, a corresponding signal regeneration operation may be stopped (S130). For example, the second switching unit 138 connected to the ground voltage GND may be turned off to stop the signal regeneration operation. In this case, the pulse corresponding to the output signal may be forcibly maintained.

As described above, according to example embodiments of the present disclosure, a regeneration operation is stopped by pulling a voltage charged to a voltage charging unit from a critical point. Thus, by eliminating an unnecessary crowbar current from the critical point to a reaching point, power consumption may be reduced. In other words, by eliminating an unnecessary crowbar current flowing between the critical point and the reaching point and preventing a voltage applied between voltage charging units from exceeding a voltage generated in a gate unit, power consumption may be reduced.

In addition, according to example embodiments of the present disclosure, a voltage added to a voltage charging unit drops by a voltage difference which occurs at a critical point to a reaching point. Thus, power consumed during charging/discharging may be reduced.

Although the present disclosure and its advantages have been described in detail, it should be understood that various changes, substitutions and alterations can be made herein without departing from the spirit and scope of the disclosure as defined by the following claims.

What is claimed is:

1. A time amplifier comprising:
   a first signal regeneration circuit configured to perform a first signal regeneration operation using a metastable state of a first latch operation on a first input signal and a delayed second input signal and output a first output signal;
   a second signal regeneration circuit configured to perform a second signal regeneration operation using a metastable state of a second latch operation on a second input signal and a delayed first input signal and output a second output signal;
   a first delay circuit configured to receive the second input signal and output the delayed second input signal by a predetermined delay time; and
   a second delay circuit configured to receive the first input signal and output the delayed first input signal by the predetermined delay time,
   wherein
   a corresponding signal regeneration operation is stopped when at least one of the first and second output signals is high, and
   the at least one output signal remains high.

2. The time amplifier as set forth in claim 1, wherein the first signal regeneration circuit comprises:
   a first latch unit configured to receive and latch the first input signal and the delayed second input signal;
   a first charging unit configured to charge an electric charge corresponding to a difference between a voltage at a first latch output node of the first latch unit and a voltage at a second latch output node of the first latch unit; and
   a first gate output unit configured to perform a logical operation on the voltage at the first latch output node and the voltage at the second latch output node to output the first output signal.

3. The time amplifier as set forth in claim 2, wherein the first latch unit includes an SR latch.

4. The time amplifier as set forth in claim 2, wherein the first latch unit comprises:
   a first NAND gate configured to perform a NAND operation on the first input signal and the voltage at the second latch output node; and a second NAND gate configured to perform a NAND operation on the delayed second input signal and the voltage at the first latch output node.

5. The time amplifier as set forth in claim 4, wherein the first NAND gate comprises:
a first PMOS transistor coupled between a power supply terminal and the first latch output node and having a gate connected to the second latch output node;
a second PMOS transistor coupled between the power supply terminal and the first latch output node and having a gate to receive the first input signal;
a first NMOS transistor coupled between the first latch output node and a first node and having a gate to receive the first input signal; and
a second NMOS transistor coupled between the first node and a third node and having a gate connected to the second latch output node.

6. The time amplifier as set forth in claim 5, wherein the second NAND gate comprises:
a third PMOS transistor coupled between the power supply terminal and the second latch output node and having a gate to receive the delayed second input signal;
a fourth PMOS transistor coupled between the power supply terminal and the second latch output node and having a gate connected to the first latch output node;
a third NMOS transistor coupled between the second latch output node and a second node and having a gate to receive the delayed second input signal; and
a fourth NMOS transistor coupled between the second node and the third node and having a gate connected to the first latch output node.

7. The time amplifier as set forth in claim 6, wherein the first latch unit further comprises:
a variable resistor coupled between the second node and the first node to adjust a gain of the time amplifier.

8. The time amplifier as set forth in claim 7, wherein the first charging unit comprises:
a capacitor coupled between the first latch output node and the second latch output node.

9. The time amplifier as set forth in claim 7, wherein the first gate output unit comprises:
an XOR gate configured to perform an XOR operation on the voltage at the first latch output node and the voltage at the second latch output node.

10. The time amplifier as set forth in claim 9, wherein the XOR gate comprises:
a fifth PMOS transistor having a source connected to the first latch output node and a gate connected to the second latch output node;
a sixth PMOS transistor having a source connected to the second latch output node and a gate connected to the first latch output node;
a fifth NMOS transistor coupled between a drain of the fifth PMOS transistor and a fourth node and having a gate connected to the second latch output node; and
a sixth NMOS transistor coupled between a drain of the sixth PMOS transistor and a fifth node and having a gate connected to the first latch output node.

11. The time amplifier as set forth in claim 10, wherein the first gate output unit comprises:
a first inverter coupled between a sixth node connected to the drain of the sixth PMOS transistor and a seventh node; and
a second inverter coupled between the seventh node and an output node to output the first output signal.

12. The time amplifier as set forth in claim 11, further comprising:
a first switching unit configured to pull up voltages at the first latch output node, the second latch output node, and the sixth node to a power supply voltage when the first output signal becomes a pulse.

13. The time amplifier as set forth in claim 12, wherein the first switching unit comprises:
a seventh PMOS transistor coupled between the power supply terminal and the first latch output node and having a gate connected to the seventh node;
an eighth PMOS transistor coupled between the power supply terminal and the second latch output node and having a gate connected to the seventh node; and
a ninth PMOS transistor coupled between the power supply terminal and the sixth node and having a gate connected to the seventh node.

14. The time amplifier as set forth in claim 11, further comprising:
a second switching unit which comprises:
a seventh NMOS transistor coupled between the third node and a ground terminal and having a gate connected to the seventh node;
an eighth NMOS transistor coupled between the fourth node and the ground terminal and having a gate connected to the seventh node; and
a ninth NMOS transistor coupled between the fifth node and the ground terminal and having a gate connected to the seventh node.

15. The time amplifier as set forth in claim 11, further comprising:
a third switching unit which comprises:
a tenth NMOS transistor having a drain connected to the sixth node and a gate to receive an inverted delayed second input signal; and
an eleventh NMOS transistor having a drain connected to a source of the tenth NMOS transistor, a source connected to a ground terminal, and a gate to receive an inverted first input signal.

16. An operating method in a time amplifier, the method comprising:
delaying a first input signal and a second input signal by a predetermined delay time;
performing a first signal regeneration operation through a first latch operation on the first input signal and the delayed second input signal;
performing a second signal regeneration operation through a second latch operation on the second input signal and the delayed second input signal; and
stopping a corresponding signal regeneration operation when at least one of output signals of the first and second signal regeneration operations becomes a pulse.

17. The method as set forth in claim 16, wherein the first and second latch operations include an SR latch operation.

18. The method as set forth in claim 16, wherein stopping the signal regeneration operation comprises:
pulling up latch output nodes of a corresponding latch operation to a power supply voltage;
pulling up an output node corresponding to an output signal to the power supply voltage; and
turning off a switching unit connected to a ground terminal.

19. The method as set forth in claim 18, further comprising:

pulling down the output node to a ground voltage when the first input signal and the second input signal disappear.

20. The method as set forth in claim 16, further comprising:
adjusting a gain using a variable resistor during at least one of the first and second signal regeneration operations.

* * * * *